(12) United States Patent
Hiraga

(10) Patent No.: US 10,296,151 B2
(45) Date of Patent: May 21, 2019

(54) DISPLAY DEVICE AND ELECTRIC DEVICE

(71) Applicant: Japan Display Inc., Tokyo (JP)

(72) Inventor: Kenta Hiraga, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/673,524

(22) Filed: Aug. 10, 2017

(65) Prior Publication Data

US 2018/0074614 A1    Mar. 15, 2018

(30) Foreign Application Priority Data

Sep. 13, 2016   (JP) ................................. 2016-178576

(51) Int. Cl.
| | |
|---|---|
| *G06F 3/044* | (2006.01) |
| *G06F 3/041* | (2006.01) |
| *H01L 51/50* | (2006.01) |

(52) U.S. Cl.
CPC ............ *G06F 3/044* (2013.01); *G06F 3/0416* (2013.01); *H01L 51/50* (2013.01)

(58) Field of Classification Search
CPC ....................................................... G06F 3/044
USPC ......................................................... 345/173
See application file for complete search history.

(56) References Cited

U.S. PATENT DOCUMENTS

| | | | | |
|---|---|---|---|---|
| 2008/0259051 A1* | 10/2008 | Ota | ........................ | G06F 3/0412 345/175 |
| 2012/0086019 A1* | 4/2012 | Kaneko | ............... | G02F 1/13338 257/82 |
| 2015/0364527 A1* | 12/2015 | Wang | .................. | H01L 27/3225 257/40 |
| 2016/0299601 A1* | 10/2016 | Yamazaki | ............... | G06F 3/044 |

FOREIGN PATENT DOCUMENTS

JP        2014-115526 A        6/2014

* cited by examiner

*Primary Examiner* — Long D Pham
(74) *Attorney, Agent, or Firm* — Typha IP LLC

(57) ABSTRACT

A display device includes a light emitting element having a light emitting region in a display region of the display device, an insulating layer covering the light emitting element, a detecting element including a first electrode, a second electrode, and a semiconductor layer having a diode characteristic sandwiched between the first electrode and the second electrode and arranged on the insulating layer, and a first connection section configured to connect the first electrode and the second electrode to a detection circuit, the detection circuit inputting a driving signal to the first electrode so that a reverse voltage is generated in the semiconductor layer and acquiring a response signal generated at the second electrode in response to the driving signal.

20 Claims, 13 Drawing Sheets

DISPLAY DEVICE AND ELECTRIC DEVICE

CROSS-REFERENCE TO RELATED APPLICATIONS

This application is based upon and claims the benefit of priority from the prior Japanese Patent Application No. 2016-178576, filed on Sep. 13, 2016, the entire contents of which are incorporated herein by reference.

FIELD

The present invention relates to a display device.

BACKGROUND

In a display device such as a thin display, a configuration in which a solar battery is used to effectively use outside light has been examined. A display device with a solar battery panel in which a panel for performing display using an organic light emitting diode (OLED) and a panel for electricity generation using a solar battery are contained in an integrated housing is disclosed in Japanese Patent Application Laid-Open No. 2014-115526.

A small and medium-sized display has been strongly desired to be made lightweight and thinned because it has been assumed to be used for a mobile terminal such as a smartphone. Various functions (e.g., touch sensor and solar light power generation functions) other than a display function has been desired to be integrated as a display device. However, if a solar battery is integrated into the display device using a technique disclosed in Japanese Patent Application Laid-Open No. 2014-115526, the entire display device cannot be avoided increasing in size. Therefore, the display device into which the solar battery is integrated is difficult to adopt as a mobile terminal using this technique.

SUMMARY

According to an aspect of the present invention, there is provided a display device including a light emitting element having a light emitting region in a display region of the display device, an insulating layer covering the light emitting element, a detecting element including a first electrode, a second electrode, and a semiconductor layer having a diode characteristic sandwiched between the first electrode and the second electrode and arranged on the insulating layer, and a first connection section configured to connect the first electrode and the second electrode to a detection circuit, the detection circuit inputting a driving signal to the first electrode so that a reverse voltage is generated in the semiconductor layer and acquiring a response signal generated at the second electrode in response to the driving signal.

DESCRIPTION OF EMBODIMENTS

Figure 1:
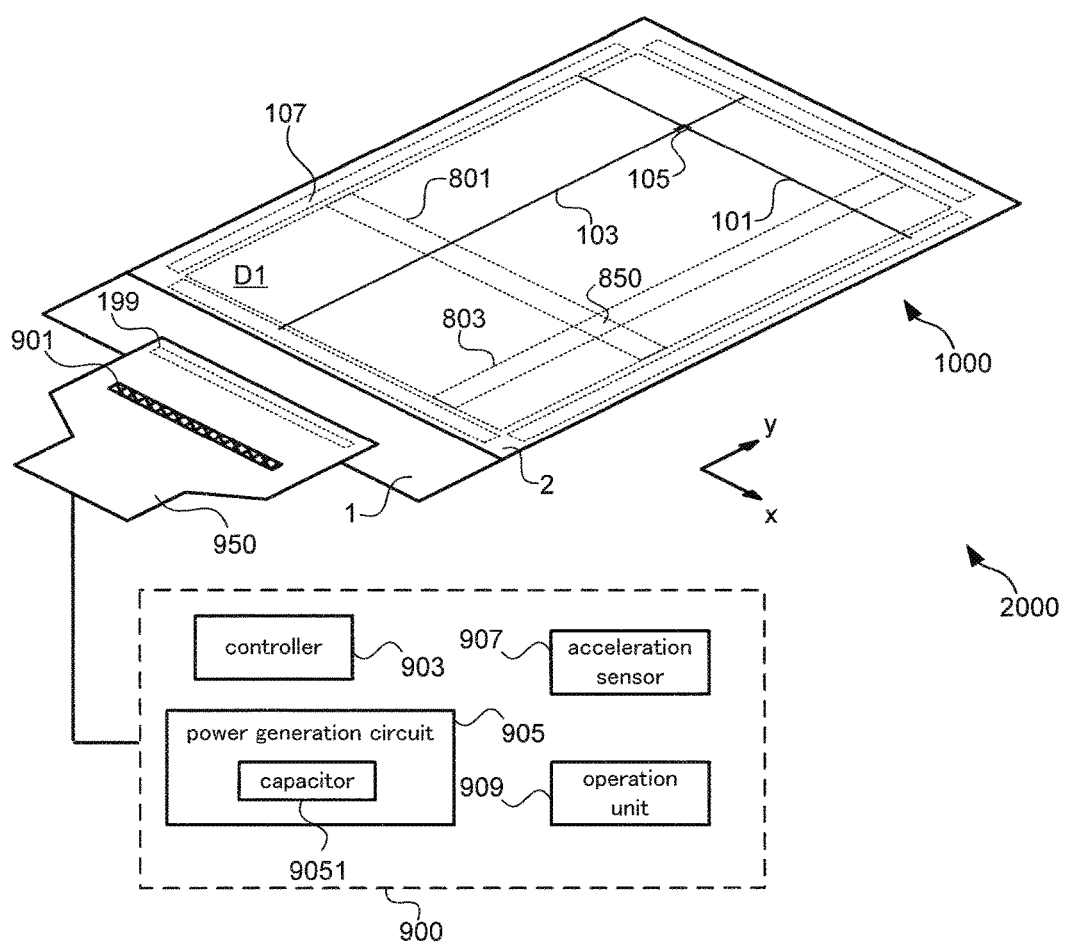
FIG. 1 is a diagram illustrating a configuration of an electric device according to a first embodiment of the present invention.

Embodiments of the present invention will hereinafter be described with reference to the drawings. The disclosure is only one example. Appropriate changes are naturally included in the scope of the present invention if they could have easily been conceived without departing from the spirit of the present invention by those skilled in the art. While the width, the thickness, the shape, and the like of each section may be more schematically indicated than those in an actual mode to make the description clearer in the drawings, this is only one example, and is not intended to limit the interpretation of the present invention. In the present specification and the drawings, detailed description may be omitted, as needed, by assigning similar elements to those described above with reference to the already described drawings the same reference signs.

Furthermore, in detailed description of the present invention, when a positional relationship between a component and another component is defined, "on" or "under" includes not only a case where the component is positioned just above or just below the other component but also a case where still another component is further interposed between the components except as otherwise limited.

First Embodiment

[Schematic Configuration]

A display device according to an embodiment of the present invention is an organic electro-luminescence (EL) display device using an OLED. The organic EL display device in this example obtains color display using a plurality of OLEDs which respectively emit lights in different colors. In this example, the OLED which emits light in red (R), the OLED which emits light in green (G), and the OLED which emits light in blue (B) are used. An OLED which emits white light may be used. In this case, color display may be obtained by passing the white light from the OLED through a color filter.

The display device has a configuration in which a first substrate and a second substrate are stuck to each other with a sticking material. An element such as a thin film transistor (TFT) for controlling a luminescent state of the OLED is arranged on the first substrate. The second substrate is a substrate serving as a cover which protects the element formed on the first substrate. The second substrate serving as the cover is not necessarily essential, and a cover layer may be directly formed on the first substrate to cover the element formed on the first substrate.

A top emission method in which the light from the OLED arranged on the first substrate is emitted toward the opposite side to the first substrate and is visually recognized by a user via the second substrate has been used. That is, a surface on the side of the second substrate, of the display device, is a display surface.

The display device according to the one embodiment of the present invention is also used as an electric device having a touch sensor function and a light power generation function, as described below. In the electric device, the touch sensor function and the light power generation function are switched when used. In this example, the touch sensor function uses a pair of electrodes respectively provided in different layers with a semiconductor layer serving as a dielectric body sandwiched therebetween as a detection electrode, to detect contact of a finger, a stylus, and the like with a display surface using a mutual capacitance method. The light power generation function is used to generate electricity with photovoltaic power generated in a photodiode formed by the pair of electrodes and the semiconductor layer provided therebetween. The present invention is directed to inhibiting a display device having a light power generation function from increasing in size.

[Configuration of Electric Device]

FIG. 1 is a diagram illustrating a configuration of an electric device according to a first embodiment of the present invention. An electric device 2000 is a terminal such as a smartphone, for example. The electric device 2000 includes a display device 1000 and a control device 900. The display device 1000 includes a first substrate 1, a second substrate 2 stuck to the first substrate 1, and a flexible printed circuit (FPC) 950 connected to a connection terminal 199 of the first substrate 1. A driver IC 901 is mounted on the FPC 950. The control device 900 controls an operation of the display device 1000 by input and output of a signal via the FPC 950.

The control device 900 includes a controller 903, a power generation circuit 905, an acceleration sensor 907, and an operation unit 909 in this example. The controller 903 is used to control the electric device 2000 by controlling a signal used in the display device 1000 and acquiring a signal generated in the display device 100. A specific content of the control will be described below.

The power generation circuit 905 includes a capacitor 9051. The power generation circuit 905 stores electric power obtained by the light power generation function of the display device 1000 in the capacitor 9051, and generates electric power required for each of components in the electric device 2000 from the stored electric power. Thus, the capacitor 9051 can also be said to be a secondary battery. In this case, the capacitor 9051 may be configured to be detachably attached to the electric device 2000.

An acceleration sensor 907 measures an acceleration, which has occurred in the electric device 2000, and outputs a signal representing a measurement result to the controller 903. The operation unit 909 includes an input device such as a power button. The operation unit 909 outputs, when information is inputted to the input device by a user performing an operation of pressing a button, for example, a signal representing the information to the controller 903.

Then, the display device 1000 will be described. A display region D1 and a driving circuit 107 are arranged on the first substrate 1 in the display device 1000. Scanning lines 101 extending in a first direction (an x-direction illustrated in FIG. 1) and data signal lines 103 extending in a second direction (a y-direction illustrated in FIG. 1) different from the first direction are arranged in the display region D1. The scanning lines 101 are arranged side by side in the second direction. The data signal lines 103 are arranged side by side in the first direction.

In this example, the first direction and the second direction vertically intersect each other. A pixel 105 is arranged at a position corresponding to an intersection between the scanning line 101 and the data signal line 103. The pixels 105 are arranged in a matrix shape. In FIG. 1, respective one signal lines extending in directions along the scanning line 101 and the data signal line 103 are arranged at the one pixel 105. Two or more signal lines extending along at least one of the scanning line 101 and the data signal line 103 may be arranged at the one pixel 105. A wiring, which supplies a predetermined voltage, such as a power supply line may be arranged in the display region D1.

The driving circuit 107 is arranged around the display region D1, and supplies a predetermined signal to the scanning lines 101 and the data signal lines 103. In this example, the driver IC 901 controls the driving circuit 107 based on a signal inputted from the controller 903. Other driving circuits may be further provided around the display region D1.

A display element including a pixel circuit and a light emitting element (an OLED) is arranged at each of the pixels 105. The pixel circuit includes a thin film transistor and a capacitor, for example. The light emitting element has a light emitting region which emits light under the control of the pixel circuit. The pixel circuit controls the light emission of the light emitting element in response to various types of signals such as a control signal fed to the scanning line 101 and a data voltage supplied to the data signal line 103. An image is displayed on the display region D1 under the control of the light emission.

The display region D1 includes a lower layer electrode 801 extending in the first direction and an upper layer electrode 803 extending in the second direction. A portion where the lower layer electrode 801 and the upper layer electrode 803 intersect each other is a detector element for implementing the touch sensor function. A semiconductor layer having a diode characteristic is arranged in this portion with it being sandwiched between the lower layer electrode 801 and the upper layer electrode 803. In this example, the detecting element can detect light having a predetermined wavelength and also implement the light power generation function for generating photovoltaic power by the detected light. Which of the touch sensor function and the light power generation function is to be implemented by the detecting element is switched in response to an instruction from the controller 903. A specific configuration will be described below.

Figure 2:
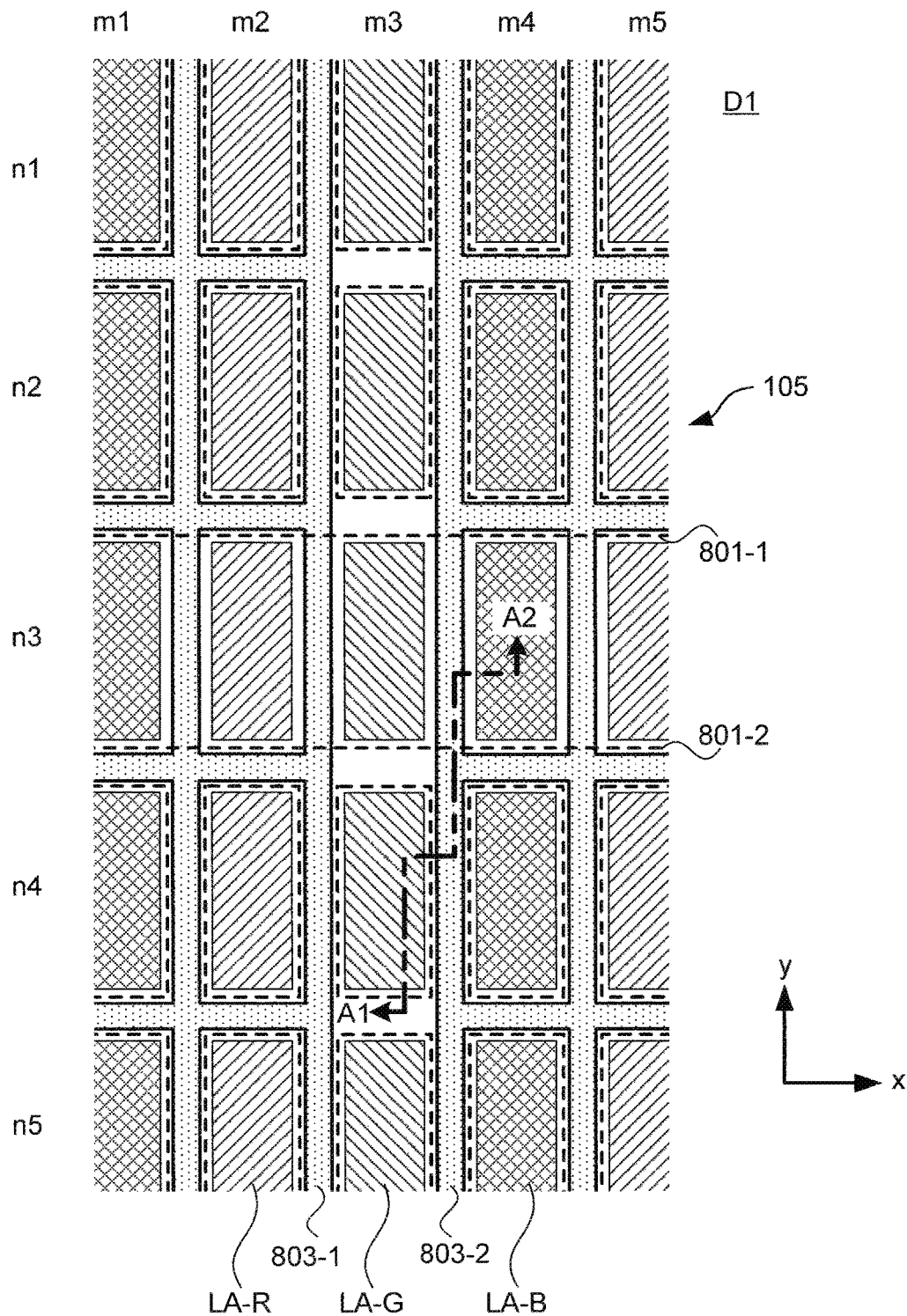
FIG. 2 is a diagram illustrating a positional relationship between a lower layer electrode and an upper layer electrode in the first embodiment of the present invention.

FIG. 2 is a diagram illustrating a positional relationship between the lower layer electrode 801 and the upper layer electrode 803 in the first embodiment of the present invention. FIG. 2 illustrates a part of the display region D1 (the pixels 105 in a range of m1 to m5 columns and n1 to n5 rows) in an enlarged manner. Any one of a red light emitting region LA-R, a green light emitting region LA-G, and a blue light emitting layer LA-B is arranged at each of the plurality of pixels 105. When colors are not particularly distinguished, each of the red, green, and blue light emitting regions LA-R, LA-G, and LA-B is described as a light emitting region LA. In this example, respective luminescent colors of the pixels 105 are arranged so that the same colors are arranged in the second direction and red, green, and blue colors are arranged in this order in the first direction. Such an arrangement is also referred to as a stripe arrangement. In an example illustrated in FIG. 2, the m2-th and m5-th columns are arranged to emit light in red. The m3-th column is arranged to emit light in green. The m1-th and m4-th columns are arranged to emit light in blue.

In the example illustrated in FIG. 2, lower layer electrodes 801-1 and 801-2 in two rows and upper layer electrodes 803-1 and 803-2 in two columns are included. In FIG. 2, the lower layer electrodes 801-1 and 801-2 are each indicated by a broken line to make a positional relationship between the lower layer electrodes 801-1 and 801-2 and the upper layer electrodes 803-1 and 803-2 easier to understand.

In this example, the lower layer electrode 801-1 surrounds the light emitting regions LA in the n1-th and n2-th rows, and is arranged not to overlap the light emitting regions LA. The lower layer electrode 801-2 surrounds the light emitting regions LA in the n4-th and n5-th rows, and is arranged not to overlap the light emitting regions LA. That is, the lower layer electrode 801-1 and the lower layer electrode 801-2 are separated with the light emitting regions LA in the n3-th row used as a boundary.

On the other hand, the upper layer electrode 803-1 surrounds the light emitting regions LA in the m1-th and m2-th columns, and is arranged not to overlap the light emitting regions LA. The upper layer electrode 803-2 surrounds the light emitting region LA in the m4-th and m5-th columns, and is arranged not to overlap the light emitting regions LA. That is, the upper layer electrode 803-1 and the upper layer electrode 803-2 are separated with the light emitting regions LA in the m3-th column used as a boundary.

While the upper layer electrode 803 has a narrower line width than that of the lower layer electrode 801, the upper layer electrode 803 may have a wider line width than that of the lower electrode 801. The lower layer electrode 801 and the upper layer electrode 803 may have the same line width.

The detecting element is formed in each of regions where the lower layer electrodes 801 and the upper layer electrodes 803 respectively overlap each other. The total area of the regions where the detecting elements exist may become larger than the total area of the light emitting regions LA depending on an arrangement of the lower layer electrodes 801 and the upper layer electrodes 803.

[Cross-Sectional Configuration of Display Device]

A cross-sectional configuration of the display device 1000 in a cutting line A1-A2 illustrated in FIG. 2 will be described below.

Figure 3:
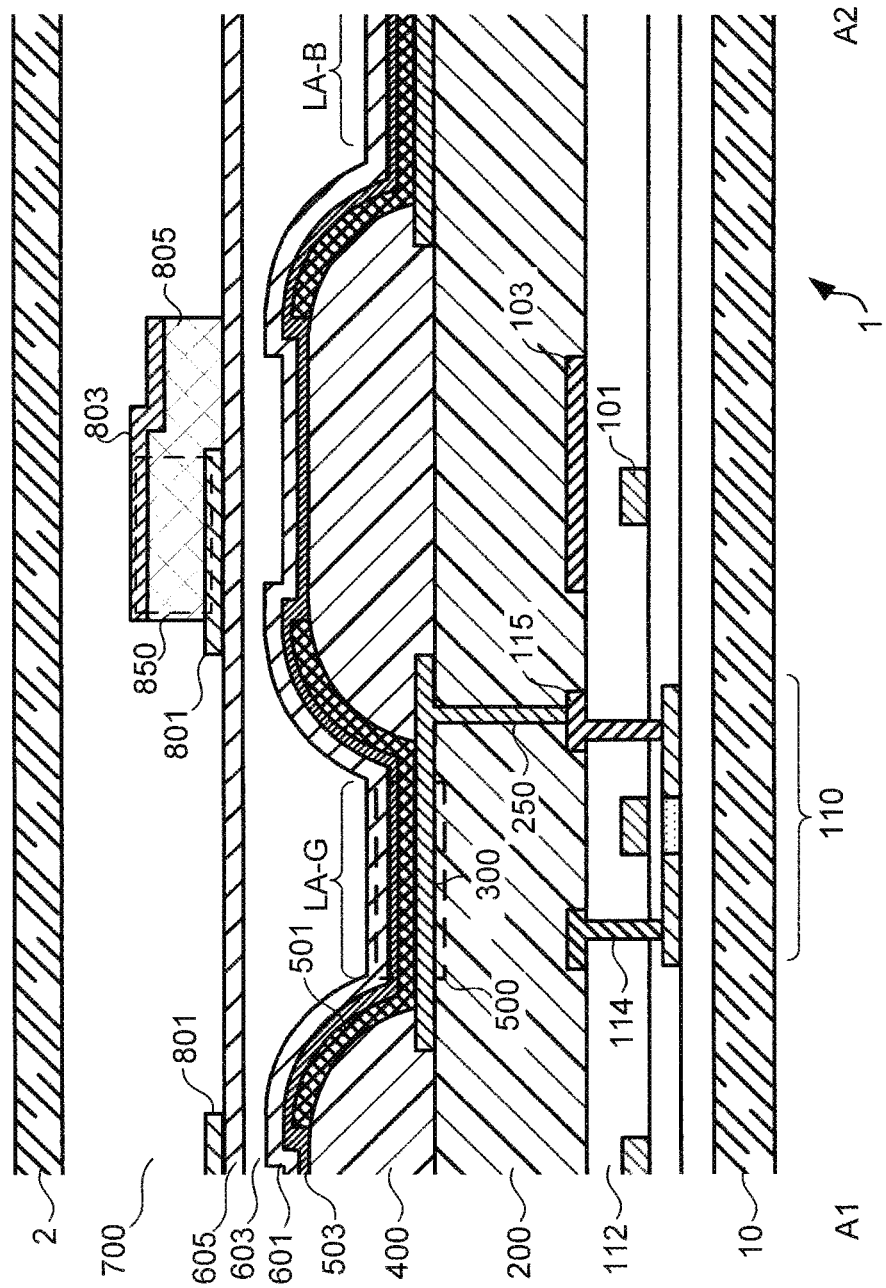
FIG. 3 is a schematic view illustrating a cross-sectional configuration (corresponding to a cutting line A1-A2 in FIG. 2) in a display region of a display device according to the first embodiment of the present invention.

FIG. 3 is a schematic view illustrating a cross-sectional configuration (corresponding to the cutting line A1-A2 in FIG. 2) in the display region of the display device according to the first embodiment of the present invention. The cross-sectional configuration described below is indicated as an end view in either case. A first supporting substrate 10 in a first substrate 1 and a second substrate 2 are each a glass substrate. One or both of the first supporting substrate 10 and the second substrate 2 may be an organic resin substrate having flexibility.

A thin film transistor 110 is arranged on the first supporting substrate 10. An interlayer insulating layer 200 having an insulating surface is arranged to cover the thin film transistor 110. A pixel electrode 300 is arranged on the interlayer insulating layer 200. The interlayer insulating layer 200 is a layer having a desired pattern formed therein through exposure, development, and calcination after photosensitive acrylic resin is applied thereto, for example. While the interlayer insulating layer 200 is represented by a single layer in FIG. 2, the interlayer insulating layer 200 may be a stack of a plurality of insulating films. In this case, wirings may be respectively provided among the plurality of insulating films. In this example, the interlayer insulating layer 200 has a stacked structure including not only acrylic resin but also a silicon nitride film (SiN) on the side of its front surface, i.e., on the side of its surface contacting the pixel electrode 300.

The pixel electrode 300 is arranged to correspond to each of the pixels 105, and is connected to a conductive layer 115 in the thin film transistor 110 via a contact hole 250 provided in the interlayer insulating layer 200. The conductive layer 115 is formed of a stacked film with an aluminum (Al) film sandwiched between titanium (Ti) films, for example. The pixel electrode 300 is used as an anode electrode of the OLED. The display device 1000 displays an image using a top emission method. Thus, the pixel electrode 300 need not have light transmissivity. In this example, the pixel electrode 300 includes a layer (e.g., a metal containing sliver) on which light emitted by the OLED is reflected and a conductive metal oxide layer (e.g., Indium Tin Oxide (ITO)) having light transmissivity on its surface contacting the OLED.

A bank layer 400 includes an opening which covers an end of the pixel electrode 300 and a portion between the adjacent pixels 105 and exposes a part of the pixel electrode 300. In this example, the bank layer 400 is formed of an organic insulating material such as acrylic resin.

A light emitting layer 501 is an OLED, and covers the pixel electrode 300 and a part of the bank layer 400 and contacts the pixel electrode 300 and the bank layer 400. The light emitting layer 501 has a stacked structure in which a plurality of types of organic materials are stacked. At least some of layers constituting the stacked structure respectively correspond to red, green, and blue colors and have different compositions. In this example, all the layers constituting the stacked structure of the light emitting layer 501 are separated from one another on the bank layer 400 at the adjacent pixels 105 respectively corresponding to the different colors. On the other hand, the layers having a common composition regardless of their luminescent colors in the stacked structure of the light emitting layer 501 need not be separated from one another at the adjacent pixels 105.

A light transmissive electrode 503 covers the light emitting layer 501, to form a cathode electrode of the OLED (an opposite electrode to the pixel electrode 300). The light transmissive electrode 503 is an electrode which transmits light from the OLED, and a metal layer or the like thin enough to transmit light or a transparent conductive metal oxide, for example, is applied thereto. The pixel electrode 300, the light emitting layer 501, and the light transmissive electrode 503 form a light emitting element 500 having a light emitting region LA. The light emitting region LA corresponds to a region of the pixel electrode 300 exposed by the bank layer 400.

Sealing layers 601, 603, and 605 are respectively layers for covering an entire display region while covering the light emitting element 500, to inhibit a component, which deteriorates the light emitting layer 501, such as water or gas, from reaching the light emitting layer 501. In this example, the sealing layers 601 and 605 are respectively inorganic insulating layers such as a silicon nitride layer. The sealing layer 603 is an organic insulating layer such as an acrylic resin layer arranged with it being sandwiched between the sealing layers 601 and 605.

A lower electrode 801 is arranged on the sealing layer 605. The semiconductor layer 805 is a layer arranged on the lower layer electrode 801 and having a diode characteristic. An upper layer electrode 803 is arranged on the semiconductor layer 805. A region where the semiconductor layer 805 is sandwiched between the lower layer electrode 801 and the upper layer electrode 803 functions as a detecting element 850. That is, the detecting element 850 is formed by the lower layer electrode 801, the upper layer electrode 803, and the semiconductor layer 805 sandwiched therebetween.

In this example, the semiconductor layer 805 has an N-type layer, an I-type layer, and a P-type layer arranged therein in this order from the side of the lower layer electrode 801. Therefore, if the lower layer electrode 801 is at a positive potential with respect to the upper layer electrode 803, the semiconductor layer 805 having a diode characteristic enters a state where a reverse voltage has been generated therein. When the semiconductor layer 805 is irradiated with light with the lower layer electrode 801 and the upper layer electrode 803 opened, a positive voltage with respect to the upper layer electrode 803 is generated as photovoltaic power in the lower layer electrode 801. This light is irradiated onto the semiconductor layer 805 from the side of the upper layer electrode 803. Thus, the upper layer electrode 803 is formed of a conductive material having transmissivity to such light.

A sticking material 700 is a material with which a portion between the first substrate 1 and the second substrate 2 is filled to stick the first substrate 1 and the second substrate 2, and is acrylic resin having light transmissivity, for example.

[Method of Manufacturing Display Device 1000]

A method of manufacturing the aforementioned display device 1000 will be described below with reference to FIGS. 4 to 10.

Figure 4:
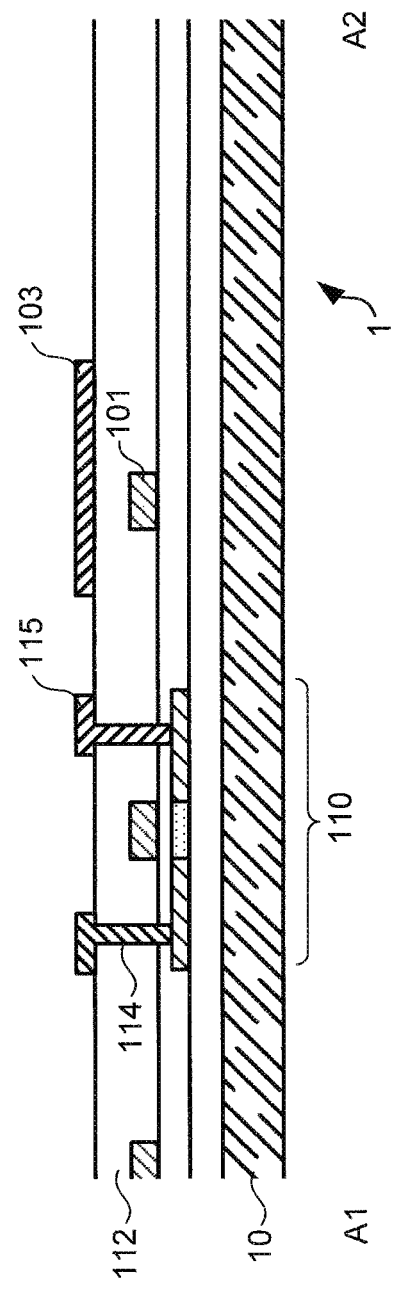
FIG. 4 is a diagram illustrating a method of manufacturing the display device (a process for forming a thin film transistor) in the first embodiment of the present invention.

FIG. 4 is a diagram illustrating a method of manufacturing the display device 1000 (a process for forming a thin film transistor) in the first embodiment of the present invention. First, a thin film transistor 110 is formed on a first supporting substrate 10. In this example, the gate of the transistor 110 and a scanning line 101 are formed of the same layer, and a conductive layer 115 connected to the source and the drain of the transistor 110 and a data signal line 103 are formed of the same layer. An insulating layer such as a silicon oxide insulating layer or a silicon nitride insulating layer may be formed between the first supporting substrate 10 and the thin film transistor 110. The insulating layer may inhibit water, gas, or the like from entering the display device 1000.

Figure 5:
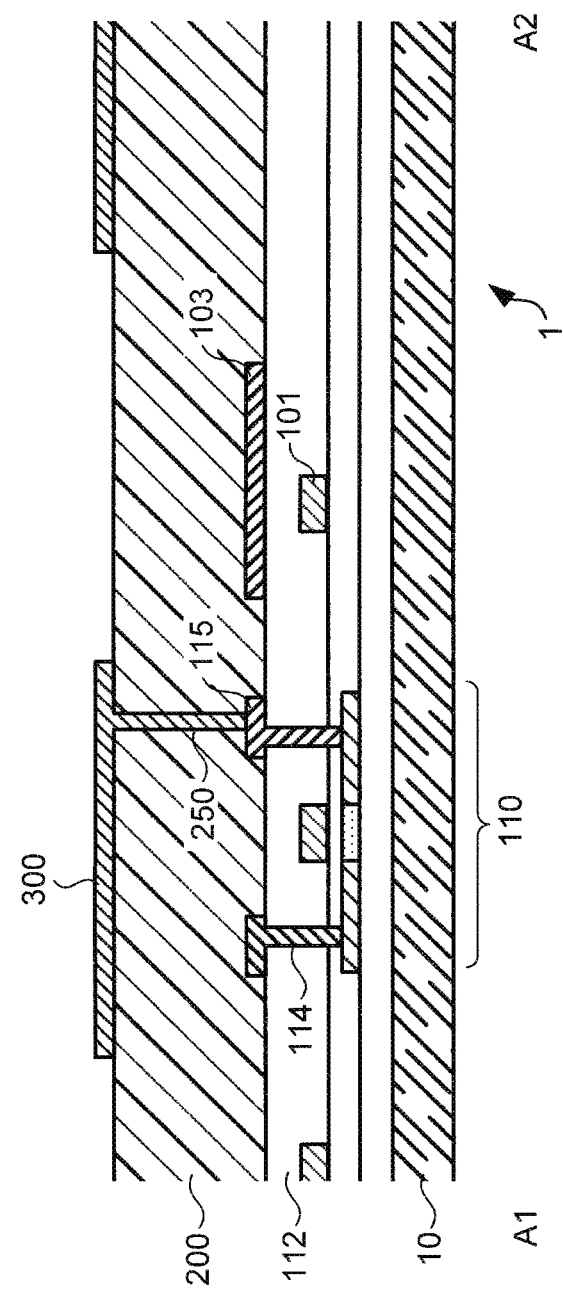
FIG. 5 is a diagram illustrating a method of manufacturing the display device (a process for forming a pixel electrode) in the first embodiment of the present invention.

FIG. 5 is a diagram illustrating a method of manufacturing the display device 1000 (a process for forming a pixel electrode) in the first embodiment of the present invention. Subsequently to the process illustrated in FIG. 4, an interlayer insulating layer 200 including a contact hole 250 is formed to cover the thin film transistor 110, and a pixel electrode 300 is formed to be connected to a conductive layer 115 via the contact hole 250 on the interlayer insulating layer 200.

Figure 6:
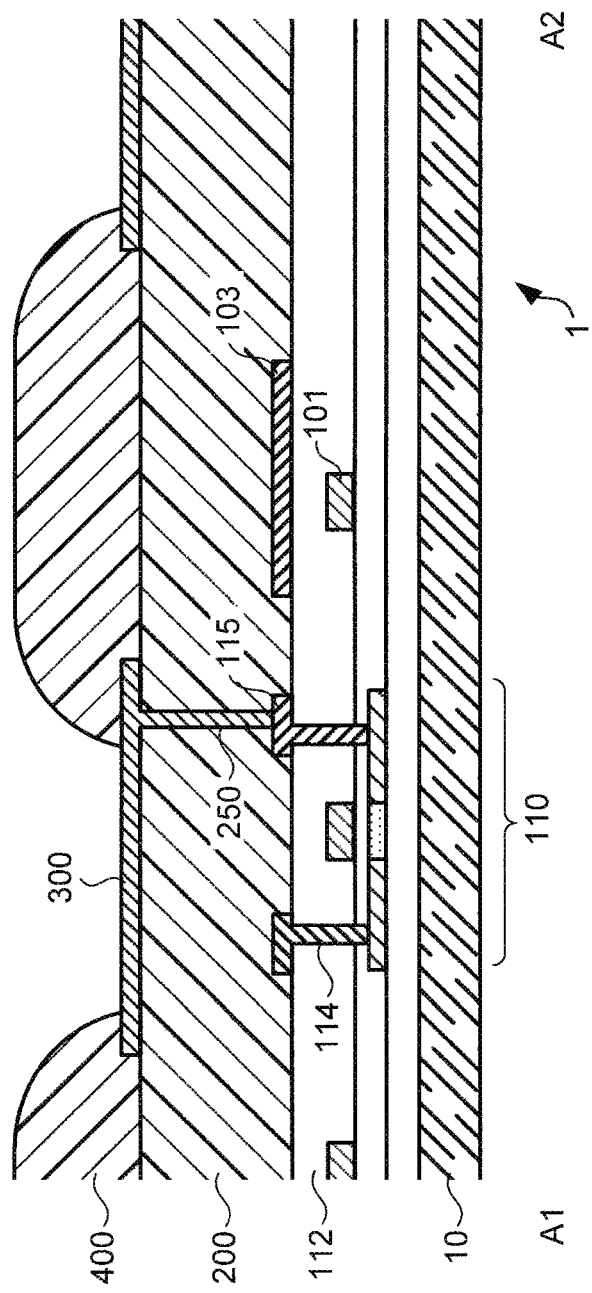
FIG. 6 is a diagram illustrating a method of manufacturing the display device (a process for forming a bank layer) in the first embodiment of the present invention.

FIG. 6 is a diagram illustrating a method of manufacturing the display device 1000 (a process for forming a bank layer) in the first embodiment of the present invention. Subsequently to the process illustrated in FIG. 5, a material (photosensitive acrylic resin in this example) composing a bank layer 400 is applied, followed by exposure, development, and calcination, to form a bank layer 400 having a desired pattern. The bank layer 400 is formed to expose a part of a surface of a pixel electrode 300.

Figure 7:
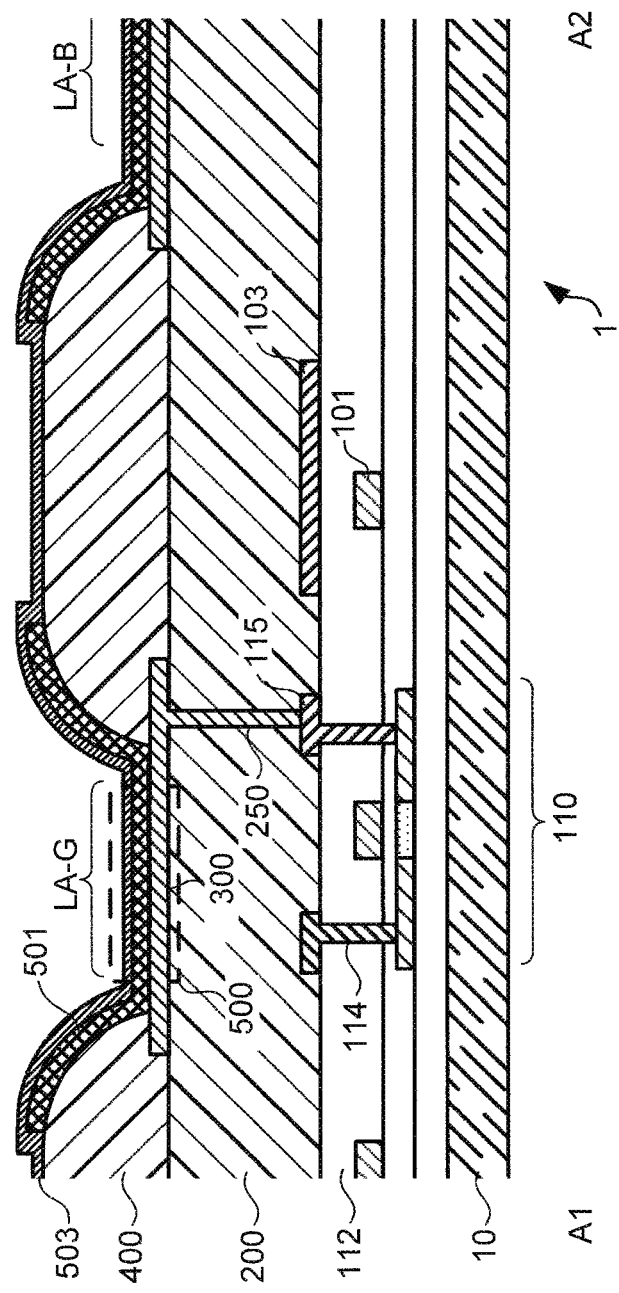
FIG. 7 is a diagram illustrating a method of manufacturing the display device (a process for forming a light emitting element) in the first embodiment of the present invention.

FIG. 7 is a diagram illustrating a method of manufacturing the display device 1000 (a process for forming a light emitting element) in the first embodiment of the present invention. Subsequently to the process illustrated in FIG. 6, a light emitting layer 501 corresponding to each of colors is formed, and a light transmissive electrode 503 is formed. Thus, a light emitting element 500 having a light emitting region LA is formed.

Figure 8:
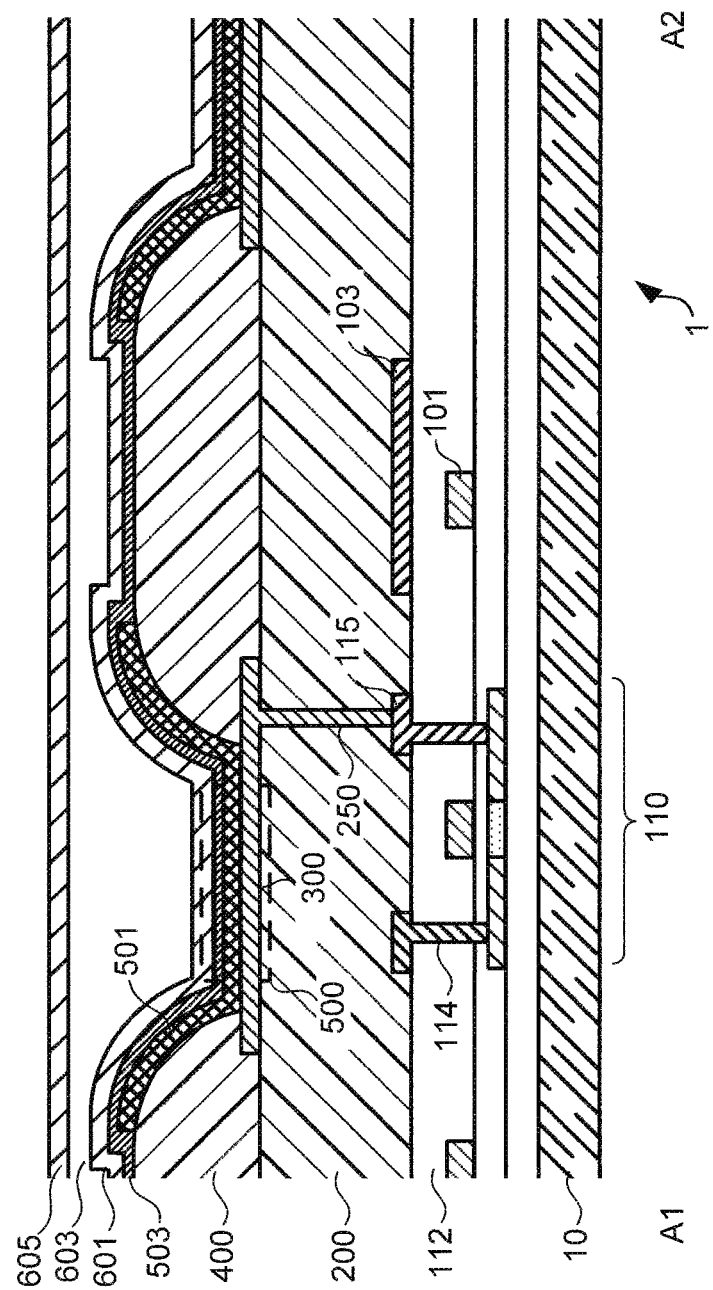
FIG. 8 is a diagram illustrating a method of manufacturing the display device (a process for sealing the light emitting element) in the first embodiment of the present invention.

FIG. 8 is a diagram illustrating a method of manufacturing the display device 1000 (a process for sealing a light emitting element) in the first embodiment of the present invention. Subsequently to the process illustrated in FIG. 7, sealing layers 601, 603, and 605 are formed in this order to cover the light transmissive electrode 503.

Figure 9:
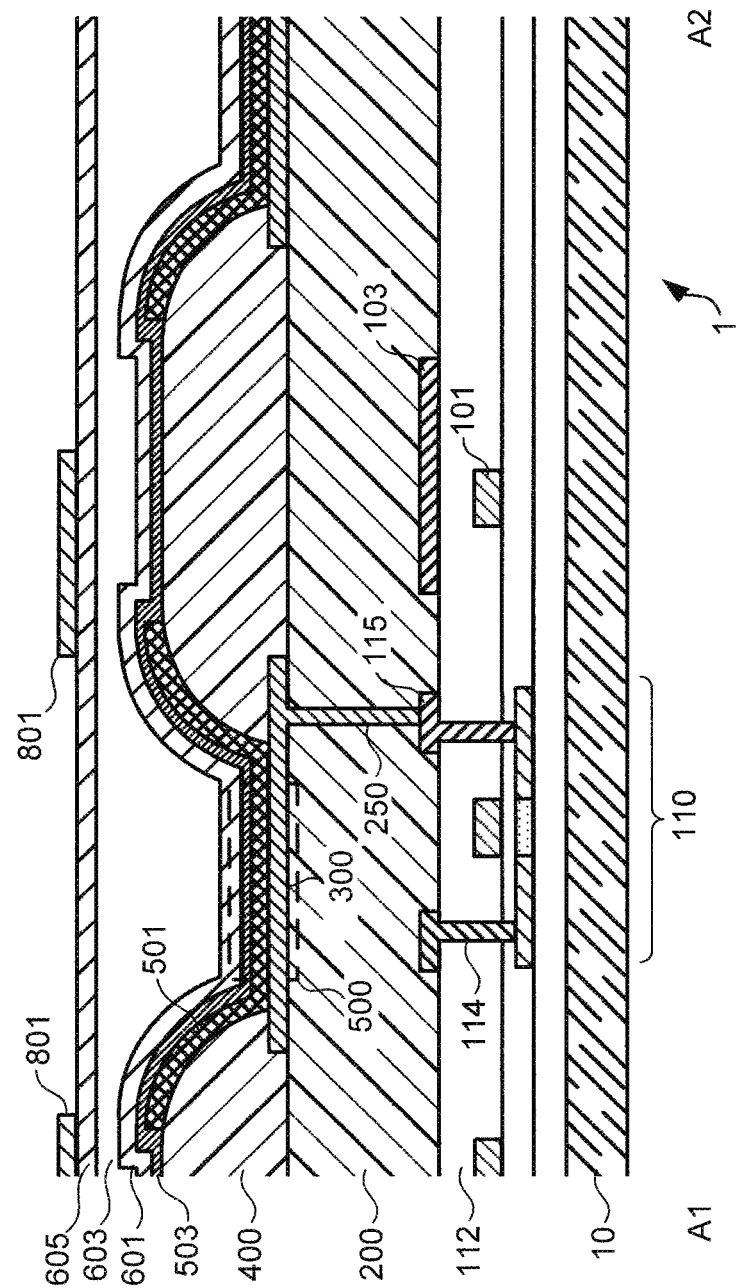
FIG. 9 is a diagram illustrating a method of manufacturing the display device (a process for forming a lower layer electrode) in the first embodiment of the present invention.

FIG. 9 is a diagram illustrating a method of manufacturing the display device 1000 (a process for forming a lower layer electrode) in the first embodiment of the present invention. Subsequently to the process illustrated in FIG. 8, a lower layer electrode 801 is formed on the sealing layer 605. The lower layer electrode 801 is formed of a conductive material, e.g., a metal such as Ti or Al or a metal compound. A conductive material may be formed on an entire surface of the sealing layer 605, and a desired pattern illustrated in FIG. 2 may be formed using photolithography. A conductive material in a desired pattern may be formed using printing, an ink jet method, or the like.

Figure 10:
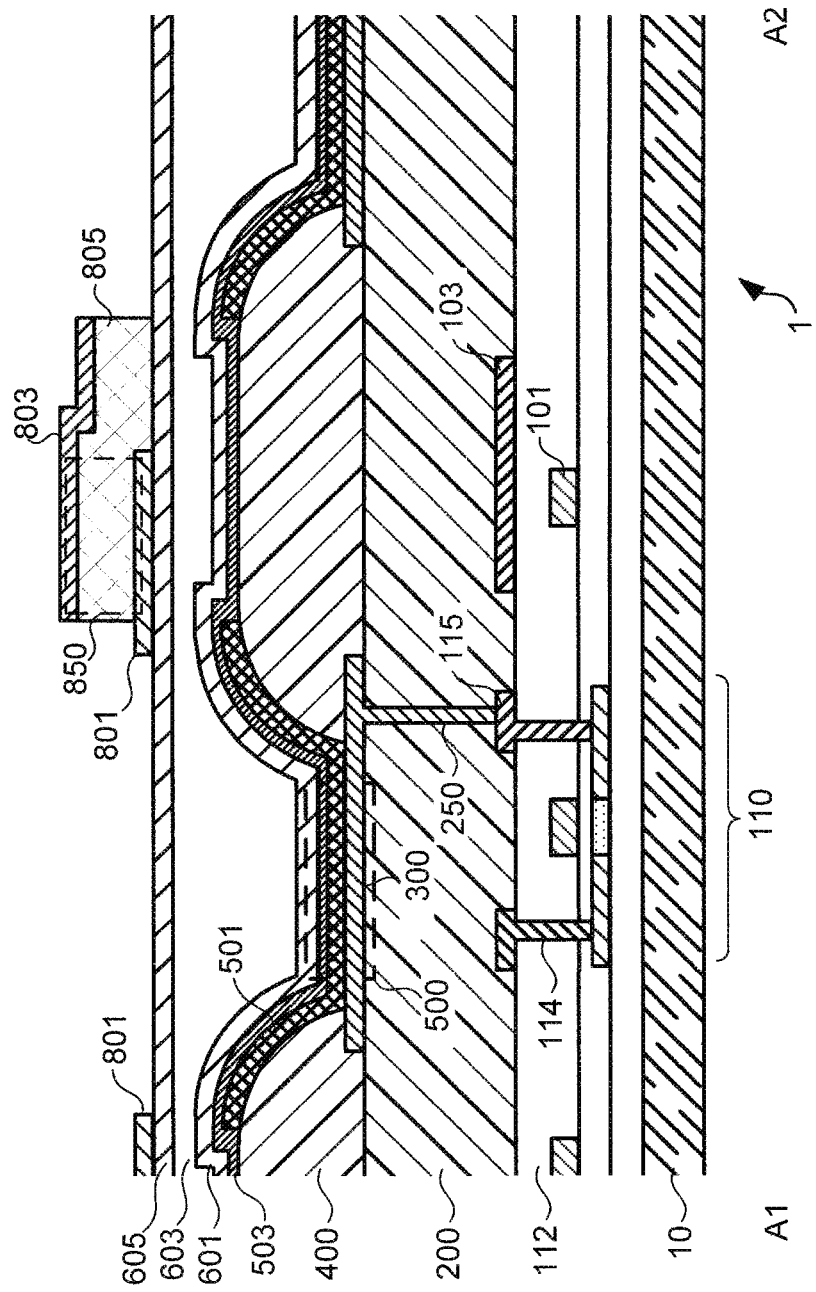
FIG. 10 is a diagram illustrating a method of manufacturing the display device (a process for forming a detecting element) in the first embodiment of the present invention.

FIG. 10 is a diagram illustrating a method of manufacturing the display device 1000 (a process for forming a detecting element) in the first embodiment of the present invention. Subsequently to the process illustrated in FIG. 9, a semiconductor layer 805 and an upper layer electrode 803 are formed. Thus, a detecting element 850 is formed. In this example, the semiconductor layer 805 is amorphous silicon, for example, and has an N-type layer, an I-type layer, and a P-type layer formed therein in this order from the side of the lower layer electrode 801, as described above. The semiconductor layer 805 may have any layered structure if it has a diode characteristic (i.e., a PN junction). The semiconductor layer 805 may be formed using not only an inorganic material but also an organic material.

The upper layer electrode 803 is a light transmissive conductive material. A metal layer thin enough to transmit light or a transparent conductive metal oxide layer, for example, is applied to the upper layer electrode 803. The upper layer electrode 803 not necessarily only has light transmissivity to a wavelength band of visible light but also has light transmissivity to an absorption wavelength for the semiconductor layer 805 to generate photovoltaic power. If the absorption wavelength of the semiconductor layer 805 is infrared light, the upper layer electrode 803 may have transmissivity enough for infrared light to reach the semiconductor layer 805, and thus need not necessarily have transmissivity to visible light.

In this example, the semiconductor layer 805 and the upper layer electrode 803 are formed in the same pattern. That is, the semiconductor layer 805 is arranged in the same pattern as that of the upper layer electrodes 803-1 and 803-2 illustrated in FIG. 2. After the lower layer electrode 801 is patterned, the semiconductor layer 805 is formed, and the upper layer electrode 803 is then formed. In this example, after the semiconductor layer 805 is formed and before the upper layer electrode 803 is formed, the semiconductor layer 805 is not patterned by a photolithography process. Then, the upper layer electrode 803 is patterned to a desired shape. According to this method, when the upper layer electrode 803 is used as a mask for the semiconductor layer 805, the semiconductor layer 805 can also be patterned in a self-alignment manner. Then, when a second substrate 2 is stuck to the first substrate 1 using a sticking material 700, a structure illustrated in FIG. 3 is obtained. The foregoing is description of the method of manufacturing the display device 1000.

If a material for the lower layer electrode 801 and a material for the upper layer electrode 803 are in a predetermined relationship, e.g., if a metal layer having a similar etching rate for predetermined etching processing is used for both the lower layer electrode 801 and the upper layer electrode 803, particularly if the same material is used for both the lower layer electrode 801 and the upper layer electrode 803, the lower layer electrode 801 may be etched at the same time that the upper layer electrode 803 is patterned. In this case, the semiconductor layer 805 and the upper layer electrode 803 may be respectively formed into different patterns while a pattern covering the entire lower layer electrode 801 may be applied to the semiconductor layer 805 so that the lower layer electrode 801 is not exposed when the upper layer electrode 803 is etched.

[Circuit Configuration and Operation Associated with Detecting Element]

Figure 11:
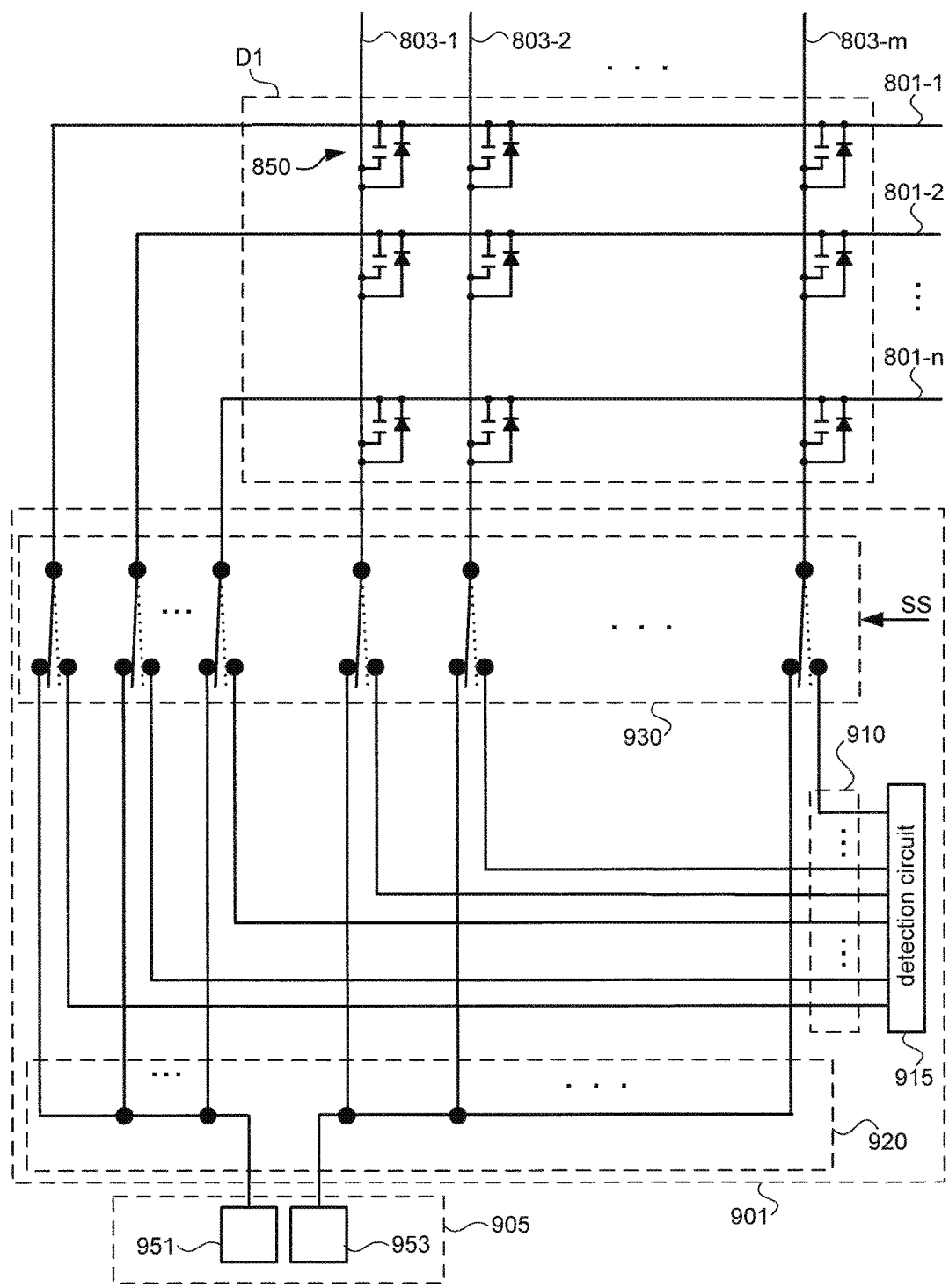
FIG. 11 is a diagram illustrating a circuit configuration associated with a detecting element in the first embodiment of the present invention.

FIG. 11 is a diagram illustrating a circuit configuration associated with a detecting element in the first embodiment of the present invention. A detecting element 850 is arranged at each of intersections between lower layer electrodes 801-1, 801-2, . . . , 801-n (referred to as lower layer electrodes 801 if they are not distinguished) and upper layer electrodes 803-1, 803-2, . . . , 803-m (referred to as upper layer electrodes 803 if they are not distinguished) in a display region D1. The detecting element 850 is represented by an equivalent circuit (a diode and a capacitor) illustrated in FIG. 11, for example. In this example, the driver IC 901 includes a first connection section 910, a second connection section 920, a detection circuit 915, and a switching section 930.

The switching section 930 performs switching between connection of the lower layer electrode 801 and the upper layer electrode 803 to the first connection section 910 (a solid line) and connection thereof to the second connection section 920 (a dotted line). The switching is performed in response to a switching signal SS inputted from the controller 903.

The first connection section 910 connects the lower layer electrode 801 and the upper layer electrode 803 to the detection circuit 915 via the switching section 930. The detection circuit 915 inputs a driving signal to the lower layer electrode 801, and acquires a response signal generated in the upper layer electrode 803 in response to the driving signal. The driving signal is a pulse-shaped voltage signal, for example, and is sequentially inputted to the lower layer electrode 801-1 to the lower layer electrode 801-n. The pulse-shaped voltage signal is such a signal that a reverse voltage is generated in the detecting element 850 (the semiconductor layer 805), i.e., a potential at the lower layer electrode 801 becomes higher than a potential at the upper layer electrode 803 in a pulse period.

In response to input of the driving signal, a response signal by capacitive coupling appears in the upper layer electrode 803. When the finger of the user contacts the display region D1, the degree of the capacitive coupling changes so that the response signal changes. A position which the finger of the user has contacted is calculated in the detection circuit 915 or the controller 903 based on the change in the response signal. Thus, if the switching section 930 connects the lower layer electrode 801 and the upper layer electrode 803 to the first connection section 910, the touch sensor function is implemented.

The second connection section 920 connects the lower layer electrode 801 to a first terminal 951 and connects the upper layer electrode 803 to a second terminal 953 via the switching section 930. At this time, two or more (all in this example) lower layer electrodes 801 are shorted, and are connected to the first terminal 951. Two or more (all in this example) upper layer electrodes 803 are shorted, and are connected to the second terminal 953. In this state, a predetermined potential difference occurs between the first terminal 951 and the second terminal 953. This potential difference becomes a value corresponding to an amount of light irradiation onto the detecting element 850, photovoltaic power of the detecting element 850, and a capacitance between the first terminal 951 and the second terminal 953.

If the first terminal 951 and the second terminal 953 are opened, an open voltage (also referred to as an open circuit voltage) corresponding to the amount of light irradiation appears. On the other hand, when a load is connected between the first terminal 951 and the second terminal 953, a voltage and a current corresponding to the load, i.e., power corresponding to the load is supplied to the load. The first terminal 951 and the second terminal 953 are included in a power generation circuit 905, and are connected to the capacitor 9051 via a charging circuit or the like or are connected to the load, for example. When the switching section 930 connects the lower layer electrode 801 and the upper layer electrode 803 to the second connection section 920, the light power generation function is implemented.

The switching signal SS is generated by the controller 903, as described above. The controller 903 generates the switching signal SS so that the light power generation function is implemented if a first condition is satisfied when the touch sensor function (a first state) has been implemented. On the other hand, the controller 903 generates the switching signal SS so that the touch sensor function is implemented if a second condition is satisfied when the light power generation function (a second state) has been implemented.

The first condition is a case where a position has not been detectable over a predetermined time period using the touch sensor function, i.e., a case where contact with the display region D1 has not been detected over a predetermined time period, for example. This is determined based on a response signal. The first condition may be a case where a video has not been displayed on a display (the display region D1) (e.g., a case where a black screen or a specific screen has been displayed over a predetermined time period).

The second condition is a case where a video has been displayed on the display (the display region D1) (may be a case where a screen other than a black screen or a specific screen has been displayed), for example. The second condition may be a case where input has been provided to the operation unit 909 or a case where it is detected that the electric device 2000 has been moved based on a measurement result of the acceleration sensor 907. The second condition may be a case where an amount of light irradiation onto the display region D1 has decreased so that an amount of power generation has fallen below a threshold value. This is determined based on respective output signals of the first terminal 951 and the second terminal 953.

Thus, the display device 1000 according to the first embodiment of the present invention can implement either one of the touch sensor function and the light power generation function while switching the functions using the detecting element 850 formed on the first substrate 1. The display device 1000 can be inhibited from becoming larger in size than a conventional display device even if it has the touch sensor function and the light power generation function.

Second Embodiment

In a second embodiment, an example in which an arrangement of respective luminescent colors of pixels is not a stripe arrangement will be described.

Figure 12:
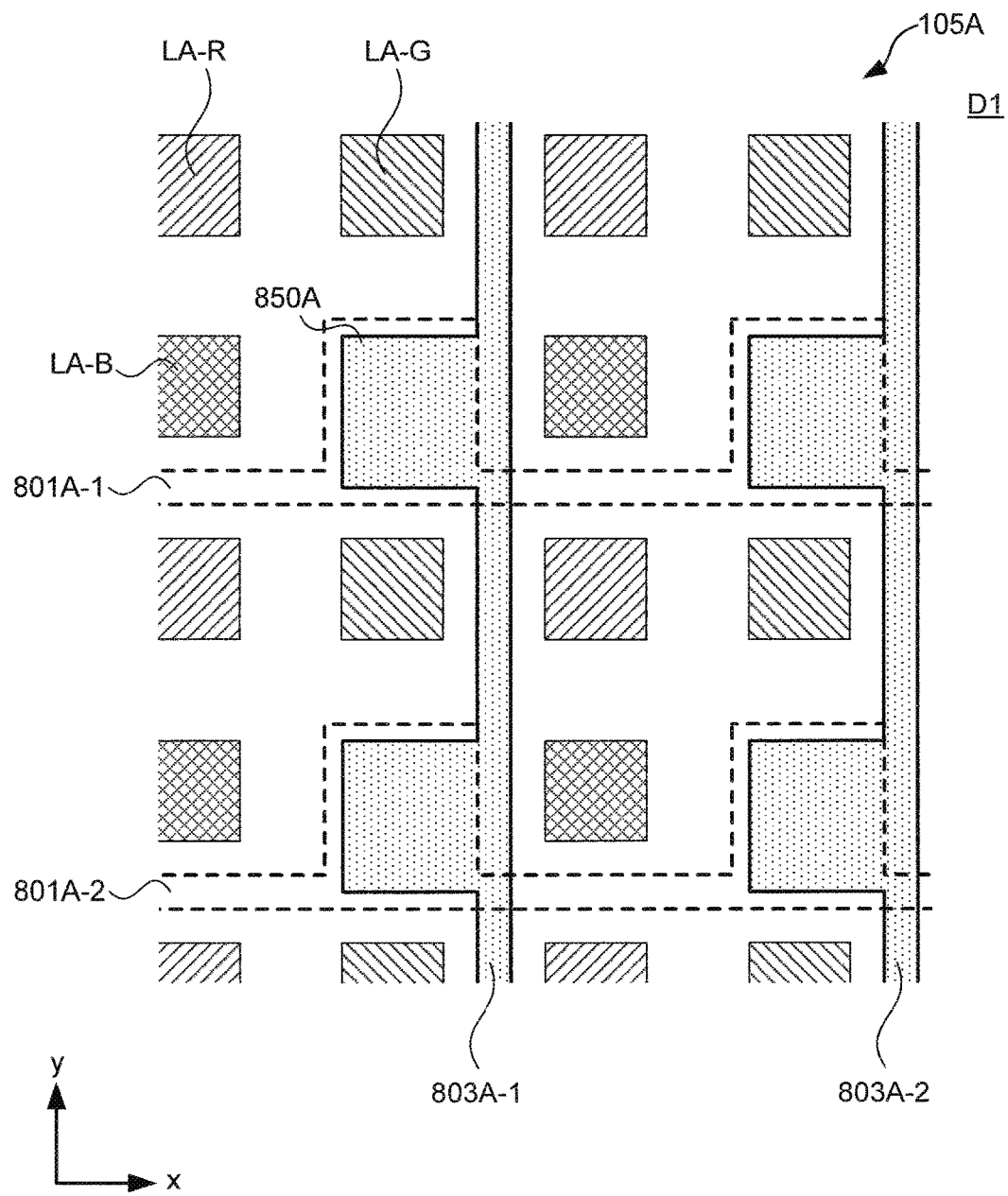
FIG. 12 is a diagram illustrating a positional relationship between a lower layer electrode and an upper layer electrode in a second embodiment of the present invention.

FIG. 12 is a diagram illustrating a positional relationship between a lower layer electrode and an upper layer electrode in the second embodiment of the present invention. As illustrated in FIG. 12, in a pixel 105A in the second embodiment, light emitting regions LA-R and LA-G are alternately arranged and light emitting regions LA-B and detecting elements 850A are alternately arranged along a first direction (an x-direction). Light emitting regions LA-R and LA-B are alternately arranged and light emitting regions LA-G and detecting elements 805A are alternately arranged along a second direction (a y-direction). According to such a configuration, the size of the detecting element 850A can be increased. Therefore, detection accuracy in a touch sensor function can be improved, and an amount of power generation in a light power generation function can be increased.

In this example, a lower layer electrode 801A-1 may be connected to a lower layer electrode 801A-2, although separated therefrom. An upper layer electrode 803A-1 may be connected to an upper layer electrode 803A-2, although separated therefrom. As illustrated in this example, lower layer electrodes 801A or upper layer electrodes 803A need not be respectively provided in all portions among adjacent pixels 105A. In other words, lower layer electrodes 801A or upper layer electrodes 803A may be respectively provided in at least some of the portions among the adjacent pixels 105A. The same can be said in the first embodiment.

Third Embodiment

While the detecting element 850 is arranged not to overlap the light emitting region LA in the first embodiment, the present invention is not limited to this. In a third embodiment, a detecting element 850B having a region overlapping a light emitting region LA will be described.

Figure 13:
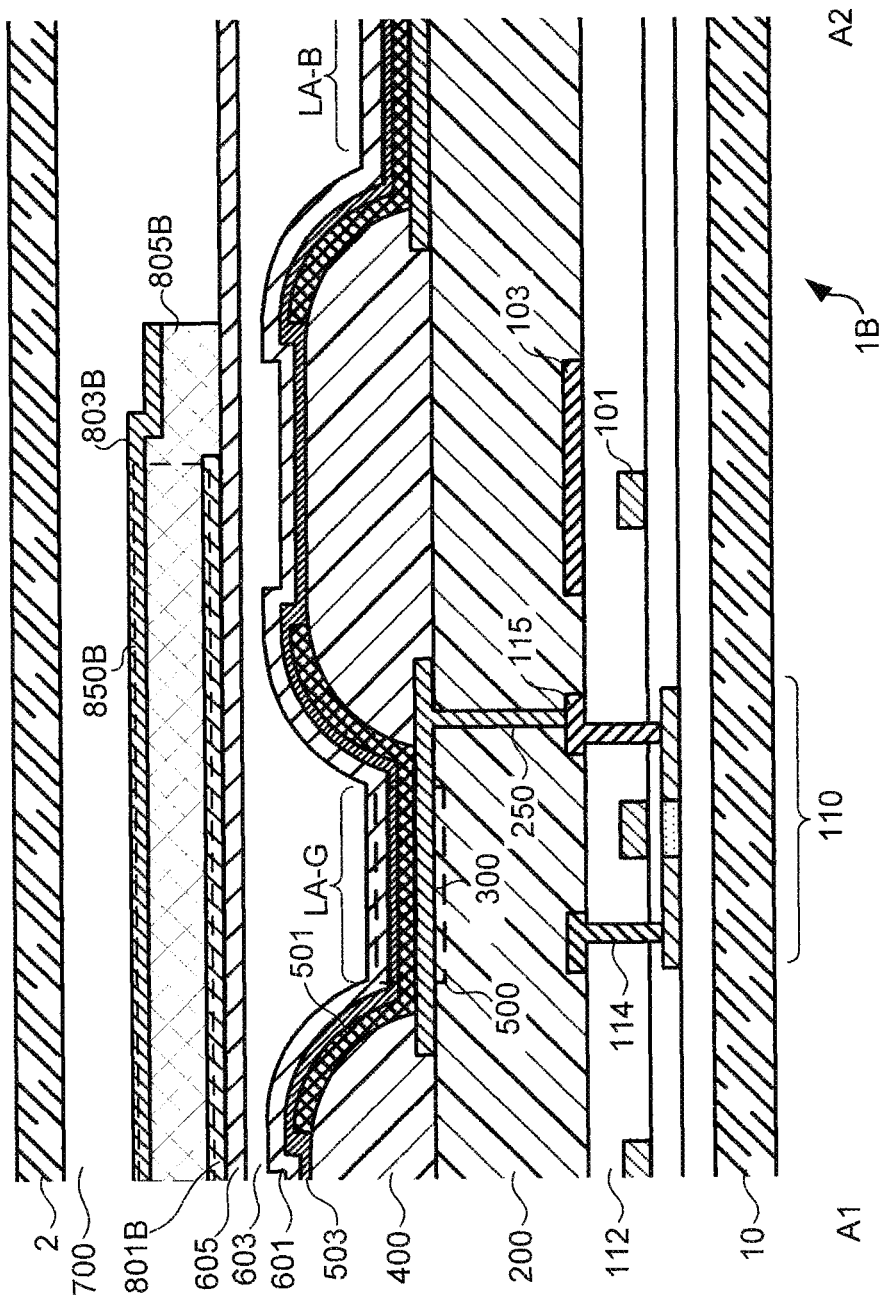
FIG. 13 is a schematic view illustrating a cross-sectional configuration in a display region of a display device according to a third embodiment of the present invention.

FIG. 13 is a schematic view illustrating a cross-sectional configuration in a display region of a display device in the third embodiment of the present invention. According to this example, a detecting element 850B spreads to a region overlapping a light emitting region LA-G when compared with the detecting element 850 in the first embodiment. In this case, a lower layer electrode 801B is also formed of a conductive material having light transmissivity, like an upper layer electrode 803B. A semiconductor layer 805B has transmissivity to a wavelength of light (a wavelength of a green color) emitted from the light emitting region LA-G. When the semiconductor layer 805B also has transmissivity to a wavelength of another color, the semiconductor layer 805B may further overlap the light emitting region LA in the corresponding color. The semiconductor layer 805B having no transmissivity to a wavelength of a green color may not overlap the light emitting region LA-G but may overlap a light emitting region in another color.

MODIFICATION

In each of the aforementioned embodiments, an electrode (first electrode) to which a driving signal is inputted by the detection circuit 915 is the lower electrode 801, and an electrode (second electrode) from which a response signal is acquired is the upper layer electrode 803. On the other hand, the upper layer electrode 803 may be the electrode (first electrode) to which the driving signal is inputted, and the lower layer electrode 801 may be the electrode (second electrode) from which the response signal is acquired. In this case, the semiconductor layer 805 may be formed of a stacked structure having a diode characteristic having an opposite polarity to that in the aforementioned embodiments, or a voltage of a driving signal (pulse signal) inputted to the upper layer electrode 803 from the detection circuit 915 may be opposite in polarity to that in the aforementioned embodiments. In either case, a reverse voltage may be generated in the semiconductor layer 805.

Within the idea of the present invention, those skilled in the art could have easily conceived various alterations and modifications, and it is understood that the alterations and the modifications belong to the scope of the present invention. For example, addition, deletion, or design change of a component or components or addition, deletion, or condition change of a process or processes to or from each of the aforementioned embodiments performed, as needed, by those skilled in the art is also included in the scope of the present invention without departing from the spirit of the invention.

What is claimed is:

1. A display device comprising:
a light emitting element having a light emitting region in a display region of the display device;
an insulating layer covering the light emitting element;
a detecting element including a first electrode, a second electrode, and a semiconductor layer having a diode characteristic sandwiched between the first electrode and the second electrode and arranged on the insulating layer;
a first connection section configured to connect the first electrode and the second electrode to a detection circuit, the detection circuit inputting a driving signal to the first electrode so that a reverse voltage is generated in the semiconductor layer and acquiring a response signal generated at the second electrode in response to the driving signal; and
a second connection section configured to connect the first electrode and the second electrode to a first terminal and a second terminal of a power generation circuit respectively.

2. The display device according to claim 1, wherein the detecting element is formed on a portion which does not overlap the light emitting region.

3. The display device according to claim 2, wherein the detecting element does not overlap the light emitting region.

4. The display device according to claim 1, wherein the detecting element is arranged at a position which overlaps the light emitting region, and has transmissivity to a wavelength of light from the light emitting region.

5. The display device according to claim 1, wherein the power generation circuit includes a capacitor connected between the first terminal and the second terminal.

6. The display device according to claim 1, wherein the power generation circuit includes a load connected between the first terminal and the second terminal.

7. The display device according to claim 1, further comprising:

a plurality of detecting elements including the first detecting element and the second detecting element
wherein
the first electrode in the first detecting element and the first electrode in the second detecting element are arranged side by side,
the second electrode in the first detecting element and the second electrode in the second detecting element are arranged side by side, and
the first electrode in the first detecting element and the first electrode in the second detecting element are connected to the first terminal in the second connection section, and
the second electrode in the first detecting element and the second electrode in the second detecting element are connected to the second terminal in the second connection section.

8. The display device according to claim 1, further comprising:
a plurality of detecting elements including the first detecting element and the second detecting element
wherein
the first electrode in the first detecting element and the first electrode in the second detecting element are arranged side by side, and
the first electrode in the first detecting element and the first electrode in the second detecting element are connected to the first terminal in the second connection section.

9. The display device according to claim 1, further comprising:
a plurality of detecting elements including the first detecting element and the second detecting element
wherein
the second electrode in the first detecting element and the second electrode in the second detecting element are arranged side by side, and
the second electrode in the first detecting element and the second electrode in the second detecting element are connected to the second terminal in the second connection section.

10. The display device according to claim 1, further comprising:
a switching section configured to connect the first electrode and the second electrode to the first connection section or the second connection section in response to a switching signal.

11. An electric device comprising:
the display device according to claim 10, and
a controller configured to output, when a first condition is satisfied in a first state where the first electrode and the second electrode are connected to the first connection section, the switching signal for switching the first state to a second state where the first electrode and the second electrode are connected to the second connection section to the switching section, and outputs, when a second condition is satisfied in the second state, the switching signal for switching the second state to the first state to the switching section.

12. The electric device according to claim 11, wherein
the first condition is a condition determined using the response signal.

13. The electric device according to claim 11, wherein
the second condition is a condition determined using a signal obtained from the first terminal and the second terminal.

14. A display device comprising:
a light emitting element having a light emitting region in a display region of the display device, the light emitting element having a pixel electrode, a light emitting layer on the pixel electrode, and a transmissive electrode on the light emitting layer;
a bank layer covering an edge of the pixel electrode and exposing a part of an upper surface of the pixel electrode;
an insulating layer covering the light emitting element;
a detecting element located at a region overlapping with the bank layer in a planar view, the detecting element having a first electrode, a semiconductor layer on the first electrode, and a second electrode on the semiconductor layer, the semiconductor layer having a diode characteristic sandwiched between the first electrode and the second electrode and arranged on the insulating layer; and
a first connection section configured to connect the first electrode and the second electrode to a detection circuit, the detection circuit inputting a driving signal to the first electrode so that a reverse voltage is generated in the semiconductor layer and acquiring a response signal generated at the second electrode in response to the driving signal.

15. The display device according to claim 14, wherein
the detecting element is formed on a portion which does not overlap the light emitting region.

16. The display device according to claim 15, wherein
the detecting element does not overlap the light emitting region.

17. The display device according to claim 14, further comprising:
a second connection section configured to connect the first electrode and the second electrode to a first terminal and a second terminal of a power generation circuit respectively.

18. The display device according to claim 17, further comprising:
a plurality of detecting elements including the first detecting element and the second detecting element wherein
the first electrode in the first detecting element and the first electrode in the second detecting element are arranged side by side,
the second electrode in the first detecting element and the second electrode in the second detecting element are arranged side by side, and
the first electrode in the first detecting element and the first electrode in the second detecting element are connected to the first terminal in the second connection section, and
the second electrode in the first detecting element and the second electrode in the second detecting element are connected to the second terminal in the second connection section.

19. The display device according to claim 17, further comprising:
a plurality of detecting elements including the first detecting element and the second detecting element wherein
the first electrode in the first detecting element and the first electrode in the second detecting element are arranged side by side, and
the first electrode in the first detecting element and the first electrode in the second detecting element are connected to the first terminal in the second connection section.

20. The display device according to claim 17, further comprising:
- a plurality of detecting elements including the first detecting element and the second detecting element wherein the second electrode in the first detecting element and the second electrode in the second detecting element are arranged side by side, and
- the second electrode in the first detecting element and the second electrode in the second detecting element are connected to the second terminal in the second connection section.

* * * * *